(12) United States Patent
Xie et al.

(10) Patent No.: US 11,133,308 B2
(45) Date of Patent: Sep. 28, 2021

(54) UNIFORM WORK FUNCTION METAL RECESS FOR VERTICAL TRANSISTOR COMPLEMENTARY METAL OXIDE SEMICONDUCTOR TECHNOLOGY

(71) Applicant: INTERNATIONAL BUSINESS MACHINES CORPORATION, Armonk, NY (US)

(72) Inventors: Ruilong Xie, Niskayuna, NY (US); Muthumanickam Sankarapandian, Niskayuna, NY (US); Chanro Park, Clifton Park, NY (US); Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/402,471

(22) Filed: May 3, 2019

(65) Prior Publication Data

US 2020/0350313 A1    Nov. 5, 2020

(51) Int. Cl.

| | |
|---|---|
| *H01L 29/78* | (2006.01) |
| *H01L 27/092* | (2006.01) |
| *H01L 29/49* | (2006.01) |
| *H01L 29/66* | (2006.01) |
| *H01L 21/8238* | (2006.01) |
| *H01L 21/28* | (2006.01) |

(52) U.S. Cl.
CPC ...... *H01L 27/092* (2013.01); *H01L 21/28008* (2013.01); *H01L 21/823828* (2013.01); *H01L 21/823864* (2013.01); *H01L 21/823885* (2013.01); *H01L 29/49* (2013.01); *H01L 29/66553* (2013.01); *H01L 29/66666* (2013.01); *H01L 29/7827* (2013.01)

(58) Field of Classification Search
CPC ............. H01L 27/092; H01L 21/28008; H01L 21/823828; H01L 21/823864; H01L 21/823885; H01L 29/49; H01L 29/66553; H01L 29/66666; H01L 29/7827
USPC ....................................................... 257/369
See application file for complete search history.

(56) References Cited

U.S. PATENT DOCUMENTS

| | | |
|---|---|---|
| 9,741,716 B1 | 8/2017 | Cheng et al. |
| 9,748,351 B2 | 8/2017 | Liu et al. |
| 9,799,570 B1 | 10/2017 | Cheng |
| 9,882,048 B2 | 1/2018 | Anderson et al. |
| 9,972,494 B1 | 5/2018 | Bentley et al. |

(Continued)

*Primary Examiner* — Hrayr A Sayadian
(74) *Attorney, Agent, or Firm* — Cantor Colburn LLP; Erik Johnson

(57) ABSTRACT

A semiconductor device includes a first transistor including a first vertical fin arranged between first bottom source or drain (S/D) region and first top S/D region, and a first recessed gate stack arranged on a sidewall of the first vertical fin. A second transistor includes second vertical fin arranged between a second bottom S/D region and second top S/D region, and a second recessed gate stack arranged on a sidewall of the second vertical fin. A first spacer contacts the sidewall of the first vertical fin and on the first recessed gate stack or the second recessed gate stack. A second spacer contacts the first spacer of the first transistor or the second transistor. The second spacer is on a sidewall of the top S/D region of the first transistor or second transistor. The inner spacer and the outer spacer include different materials.

6 Claims, 20 Drawing Sheets

(56) References Cited

U.S. PATENT DOCUMENTS

| | | | |
|---|---|---|---|
| 10,103,247 B1 | 10/2018 | Xie et al. | |
| 10,164,119 B2* | 12/2018 | Mallela | H01L 21/84 |
| 10,199,278 B2 | 2/2019 | Cheng et al. | |
| 2016/0172362 A1* | 6/2016 | Basker | H01L 27/1211 |
| | | | 257/401 |
| 2019/0148494 A1* | 5/2019 | Xie | H01L 23/522 |
| | | | 438/268 |

* cited by examiner

UNIFORM WORK FUNCTION METAL RECESS FOR VERTICAL TRANSISTOR COMPLEMENTARY METAL OXIDE SEMICONDUCTOR TECHNOLOGY

BACKGROUND

The present invention generally relates to fabrication methods and resulting structures for semiconductor devices. More specifically, the present invention relates to methods and resulting structures for achieving uniform work function metal recesses for vertical transistor complementary metal oxide semiconductor (CMOS) technology.

In an integrated circuit, each metal oxide semiconductor field effect transistor (MOSFET) has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. CMOS is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

Vertical transistors are attractive candidates for device scaling. Such transistors include source/drain regions on opposing ends of a vertical channel region (or fin) surrounded by a metal gate.

SUMMARY

Embodiments of the present invention are directed to a semiconductor device. A non-limiting example of the semiconductor device includes a first transistor include a first vertical fin arranged between a first bottom source or drain (S/D) region and a first top S/D region, and a first recessed gate stack arranged on a sidewall of the first vertical fin. The semiconductor device includes a second transistor including a second vertical fin arranged between a second bottom S/D region and a second top S/D region, and a second recessed gate stack arranged on a sidewall of the second vertical fin. The semiconductor device includes a first spacer arranged in contact with the sidewall of the first vertical fin and on the first recessed gate stack of the first transistor or the second recessed gate stack of the second transistor. The semiconductor further includes a second spacer arranged in contact with the first spacer of the first transistor or the second transistor, and the second spacer is arranged on a sidewall of the top S/D region of the first transistor or the second transistor. The inner spacer and the outer spacer include different materials.

Another non-limiting example of the semiconductor device includes a first transistor including a vertical fin arranged between a bottom source/drain and a top source/drain, a recessed gate stack arranged on a sidewall of the vertical fin, and a first spacer arranged in contact the vertical fin and on the recessed gate stack. The first transistor also includes a second spacer arranged in contact with the first spacer and lining a sidewall of the top source/drain. The semiconductor device also includes a second transistor including a vertical fin arranged between a bottom source/ drain and a top source/drain, a recessed gate stack arranged on a sidewall of the vertical fin, and a first spacer arranged in contact the vertical fin and on the recessed gate stack. The second transistor further includes a second spacer arranged in contact with the first spacer and lining a sidewall of the top source/drain.

Embodiments of the present invention are also directed to a method for fabricating a semiconductor device. A non-limiting example of the method includes removing a first hard mask on a vertical fin of a first transistor, and a second hard mask of a vertical fin of a second transistor. The method further includes recessing a portion of a gate stack of the first transistor, a gate stack of the second transistor, or the gate stacks of both the first transistor and the second transistor to form an opening adjacent to the vertical fin. The method includes depositing a first spacer material in the opening to form an inner spacer on the vertical fin of the first transistor, the second transistor, or both the first transistor and the second transistor. The method further includes depositing a second spacer material on the vertical fin of each of the first transistor and the second transistor. The first spacer material and the second spacer material include different materials.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 1-10 depict a process flow for forming a semiconductor device according to embodiments of the present invention, in which:

FIG. 1 depicts a cross-sectional side view of the semiconductor device subsequent to forming fins of a first transistor and a second transistor;

FIG. 2 depicts a cross-sectional side view of the semiconductor device subsequent to depositing gate stack materials on the fins;

FIG. 3 depicts a cross-sectional side view of the semiconductor device subsequent to depositing an interlayer dielectric (ILD);

FIG. 4 depicts a cross-sectional side view of the semiconductor device subsequent to removing the hard mask caps;

FIG. 5 depicts a cross-sectional side view of the semiconductor device subsequent to selectively removing a portion of the gate stack from the second transistor to form openings adjacent to the fin;

FIG. 6 depicts a cross-sectional side view of the semiconductor device subsequent to depositing a spacer material in the openings;

FIG. 7 depicts a cross-sectional side view of the semiconductor device subsequent to further recessing gate stacks of both the first transistor and second transistor;

FIG. 8 depicts a cross-sectional side view of the semiconductor device subsequent to depositing another spacer material on recessed gate stacks of the first transistor and the second transistor;

FIG. 9 depicts a cross-sectional side view of the semiconductor device subsequent to etching the spacer material of the second transistor to expose the fin; and FIG. 10 depicts a cross-sectional side view of the semiconductor device subsequent to etching the spacer material of the first transistor to expose the fin and forming top source/drains in both transistors;

FIGS. 11-16 depict a process flow for forming a semiconductor device according to embodiments of the present invention, in which:

FIG. 11 depicts a cross-sectional side view of the semiconductor device of FIG. 4, subsequent to selectively removing a portion of the gate stack from the first transistor to form openings adjacent to the fin;

FIG. 12 depicts a cross-sectional side view of the semiconductor device subsequent to depositing a spacer material in the openings;

FIG. 13 depicts a cross-sectional side view of the semiconductor device subsequent to widening the diameter of the openings in the ILD over the fin of the first transistor;

FIG. 14 depicts a cross-sectional side view of the semiconductor device subsequent to recessing a portion of the gate stack of the second transistor;

FIG. 15 depicts a cross-sectional side view of the semiconductor device subsequent to further recessing the gate stack of the second transistor; and FIG. 16 depicts a cross-sectional side view of the semiconductor device subsequent to forming spacers and top source/drains;

FIGS. 17-20 depict a process flow for forming a semiconductor device according to embodiments of the present invention, in which:

FIG. 17 depicts a cross-sectional side view of the semiconductor device of FIG. 11, subsequent to selectively removing a portion of the gate stack from the first transistor and recessing the ILD;

FIG. 18 depicts a cross-sectional side view of the semiconductor device subsequent to recessing a portion of the gate stack of the second transistor;

FIG. 19 depicts a cross-sectional side view of the semiconductor device subsequent to depositing spacer material in openings adjacent to fins of the first transistor and the second transistor; and FIG. 20 depicts a cross-sectional side view of the semiconductor device subsequent to further recessing the gate stack of the second transistor, forming spacers, and top source/drains.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, as MOSFETs are scaled to smaller dimensions, various designs and techniques are employed to improve device performance. Vertical transistors are attractive candidates for smaller device scaling and include source/drain regions on opposing ends of a vertical channel region (or fin) surrounded by a metal gate. The metal gate materials and thicknesses can differ between types of transistors in CMOS technology. Due to the different thicknesses, the materials are etched at different rates after hard mask removal, can result in non-uniform gate heights among adjacent transistors.

Turning now to an overview of the aspects of the invention, one or more embodiments of the invention address the above-described shortcomings of the prior art by providing fabrication methods and resulting structures that include different dielectric spacer materials and thicknesses for the top end spacer beneath the top source/drain of different transistors.

The above-described aspects of the invention address the shortcomings of the prior art by using different spacer materials and thicknesses to provide uniform height metal gate stacks in adjacent transistors.

Figure 1:
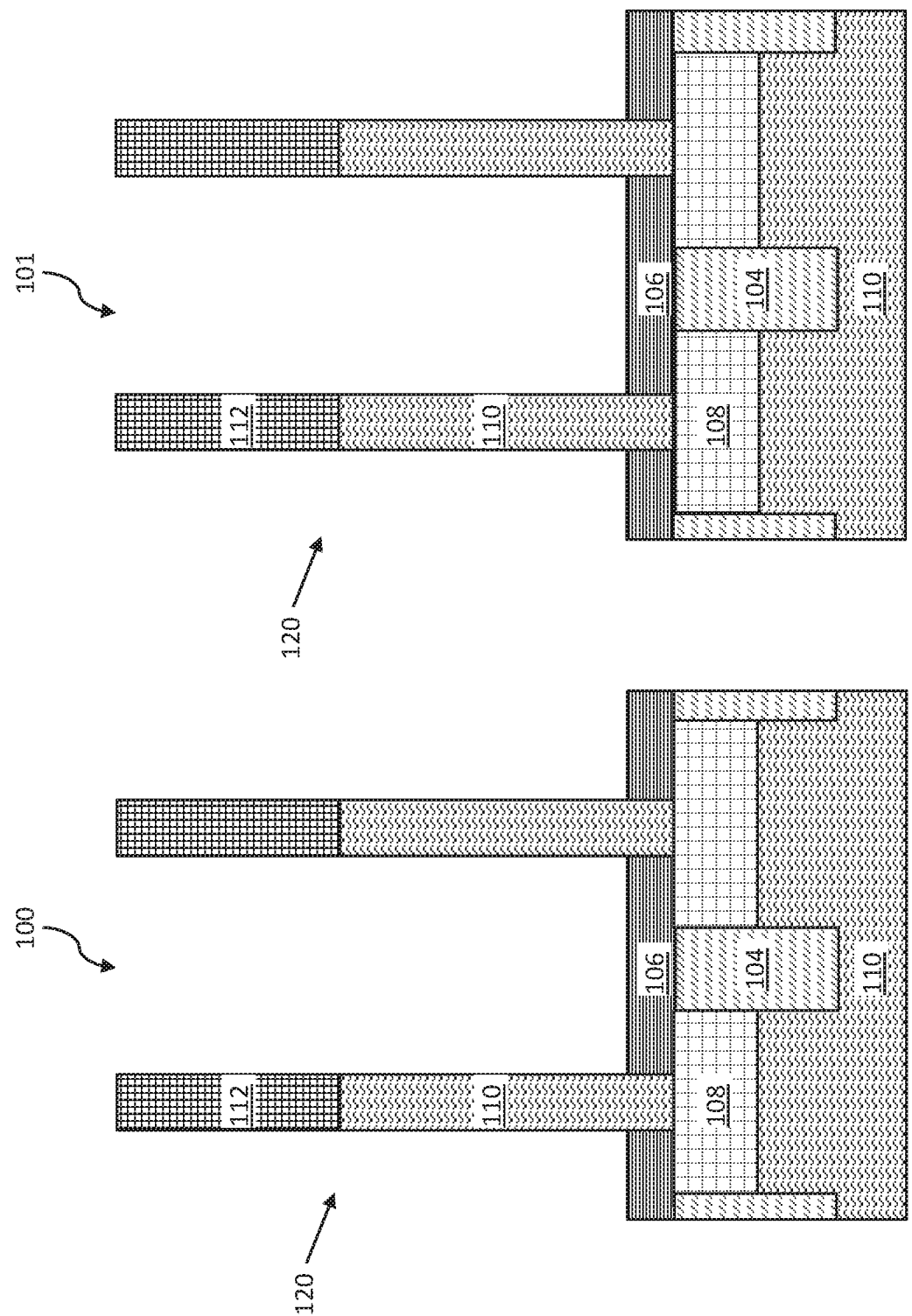

Turning now to a more detailed description of aspects of the present invention, FIGS. 1-10 depict a process flow for forming a semiconductor device according to embodiments of the present invention. FIG. 1 depicts a cross-sectional side view of the semiconductor device subsequent to forming fins 120 (also referred to as a vertical fin or vertical channel) of a first transistor 100 and a second transistor 101. According to some embodiments of the present invention, the first transistor 100 is an NFET, and the second transistor 101 is a PFET.

Each of the fins 120 for formed etched in the substrate 110, which includes a semiconductor material. Non-limiting examples of suitable substrate 110 materials include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof.

The fins 120 each include a hard mask cap 112. The fins 120 can be formed in the substrate 110 by depositing a hard mask material over the substrate 110, followed by patterning and etching. The fins 120 also can be patterned in the substrate by, for example, sidewall imaging transfer.

Isolation regions 104 are formed between the active areas of the first transistor 100 and the second transistor 101. Isolation regions 104 can also be formed between different devices within NFET or PFET regions. The isolation regions 104 can be formed by any known method in the art, including, for example, lithography and etching to form trenches in the substrate 110, and then filling the trenches with an insulating material, such as silicon dioxide. An active region (also referred to as a bottom source/drain 108) is defined as the region between a pair of isolation regions 104. According to one or more embodiments, the isolation regions 104 are shallow trench isolation regions (STIs). However, the isolation regions 104 can be trench isolation regions, field oxide isolation region (not shown), or any other equivalent known in the art.

The bottom source/drains 108 include a semiconductor material arranged on the substrate 110. The fins 120 extend from the bottom source/drains 108. According to one or more embodiments of the present invention, the semiconductor material includes epitaxially grown semiconductor material. The source/drains 108 are doped with an n-type dopant (e.g., phosphorus, arsenic, or antimony) or a p-type dopant (e.g., boron), depending on the type of transistor.

Bottoms spacers 106 are formed on the bottom source/drains 108. The bottom spacers 106 include an insulating material, for example, silicon dioxide, silicon nitride, SiOCN, or SiBCN. Other non-limiting examples of materials for the bottom spacers 106 include dielectric oxides (e.g., silicon oxide), dielectric nitrides (e.g., silicon nitride), dielectric oxynitrides, or any combination thereof.

Figure 2:
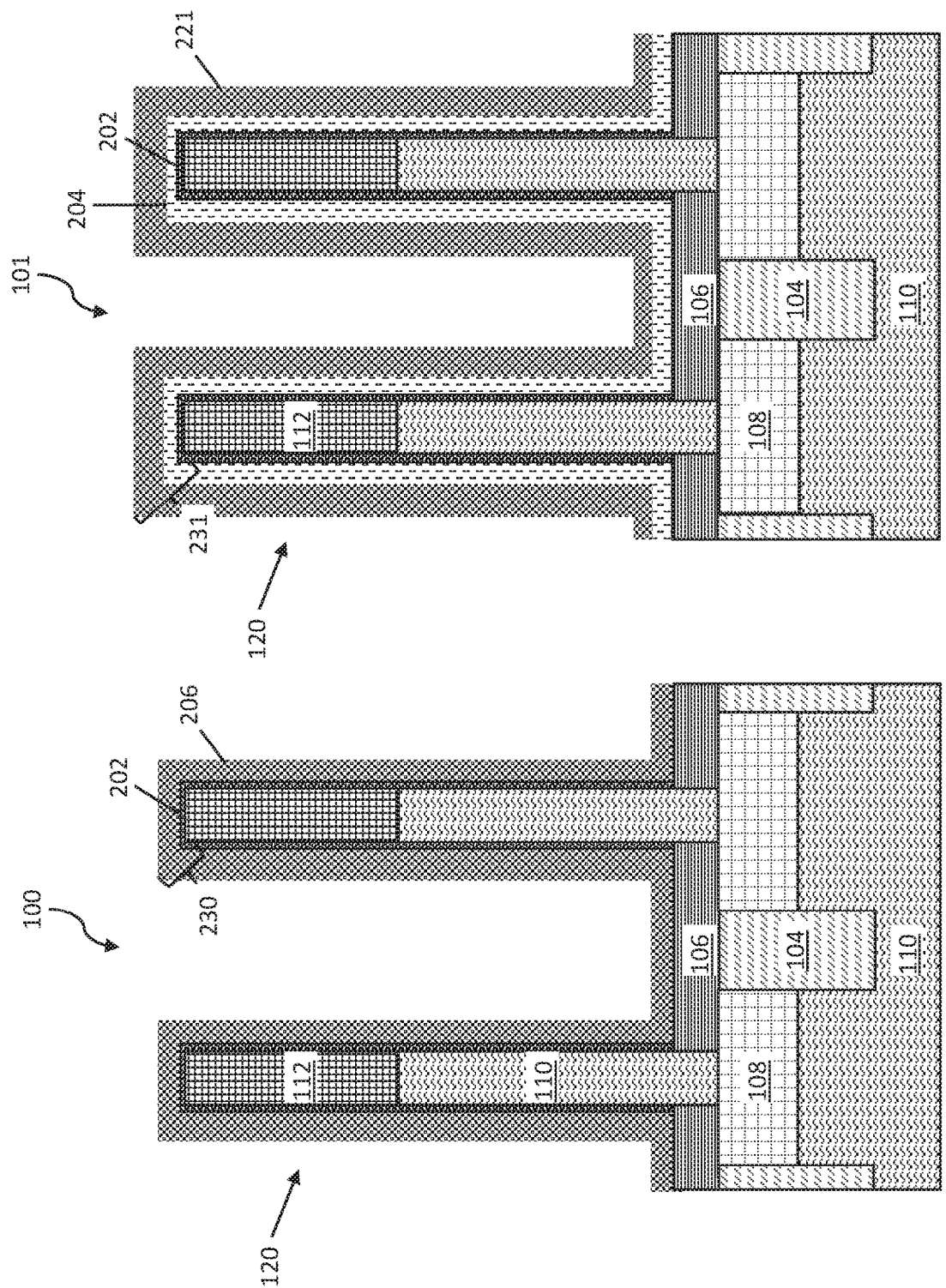

FIG. 2 depicts a cross-sectional side view of the semiconductor device subsequent to depositing gate stack materials on the fins 120. The gate stack 230 of the first transistor 100 and the gate stack 231 of the second transistor 101 each includes a dielectric layer 202. The dielectric layers 202 encapsulate the fins 120. Non-limiting examples of suitable materials for the dielectric layers 202 include oxides, nitrides, oxynitrides, silicates (e.g., metal silicates), aluminates, titanates, nitrides, or any combination thereof. Examples of high-k materials for the dielectric layers 202 include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

The work function metal 206 of the first transistor 100 includes one, two, three, or more work function metal layers. The type of work function metals depends on the type of transistor. According to some embodiments of the present invention, the gate stack 230 of the first transistor 100 includes n-type work function metals, such as hafnium, zirconium, titanium, tantalum, aluminum, metal carbides (e.g., hafnium carbide, zirconium carbide, titanium carbide, and aluminum carbide), aluminides, or any combination thereof. According to exemplary embodiments of the present invention, the work function metals 206 of the first transistor 100 mainly include titanium carbide or TiAlC, or alternatively, can include thin TiN liners with a TiC (or TiAlC) layer.

The gate stack 231 of the second transistor 101 also include one, two, three, or more work function metal layers. The type of work function metals depends on the type of transistor. According to some embodiments, the gate stack 231 of the second transistor 101 includes p-type work function metals, such as titanium nitride (TiN), tantalum nitride (TaN), ruthenium, palladium, platinum, cobalt, nickel, and conductive metal oxides, or any combination thereof. According to exemplary embodiments of the present invention, the gate stack 231 of the second transistor 101 includes a first work function metal 204 (titanium nitride) and a second work function metal 221 includes the same metals as work function metal 206. According to some embodiments of the present invention, second work function metal 221 includes mainly include titanium carbide or TiAlC, or alternatively, can include thin TiN liners with a TiC (or TiAlC) layer.

The work function metal stacks of the first transistor 100 and second transistor 101 are formed by depositing a first work function metal (e.g., a PFET work function metal) on both transistors by atomic layer deposition (ALD) (which is work function metal 204). Using a patterning mask to protect second transistor 101 region, the first transistor 100 region is opened, and the work function metal 204 is removed from the first transistor 100. Another work function metal 206 (e.g., a NFET work function metal) is deposited on both transistors, which results in work function metal 206 and second work function metal 221 being the same.

As shown, the work function metals 206 of the gate stack 230 of the first transistor 100 have a different thickness than the work function metals (first work function metal 204 and second work function metal 221) of the gate stack 231 of the second transistor 101. The work function metals 206 of the gates stack 230 of the first transistor 100 are different than the work function metals (first work function metal 204 and second work function metal 221) of the gate stack 231 of the second transistor 101. According to exemplary embodiments of the present invention, the gate stack 230 of the first transistor 100 is thinner than the gate stack 231 of the second transistor 101.

Figure 3:
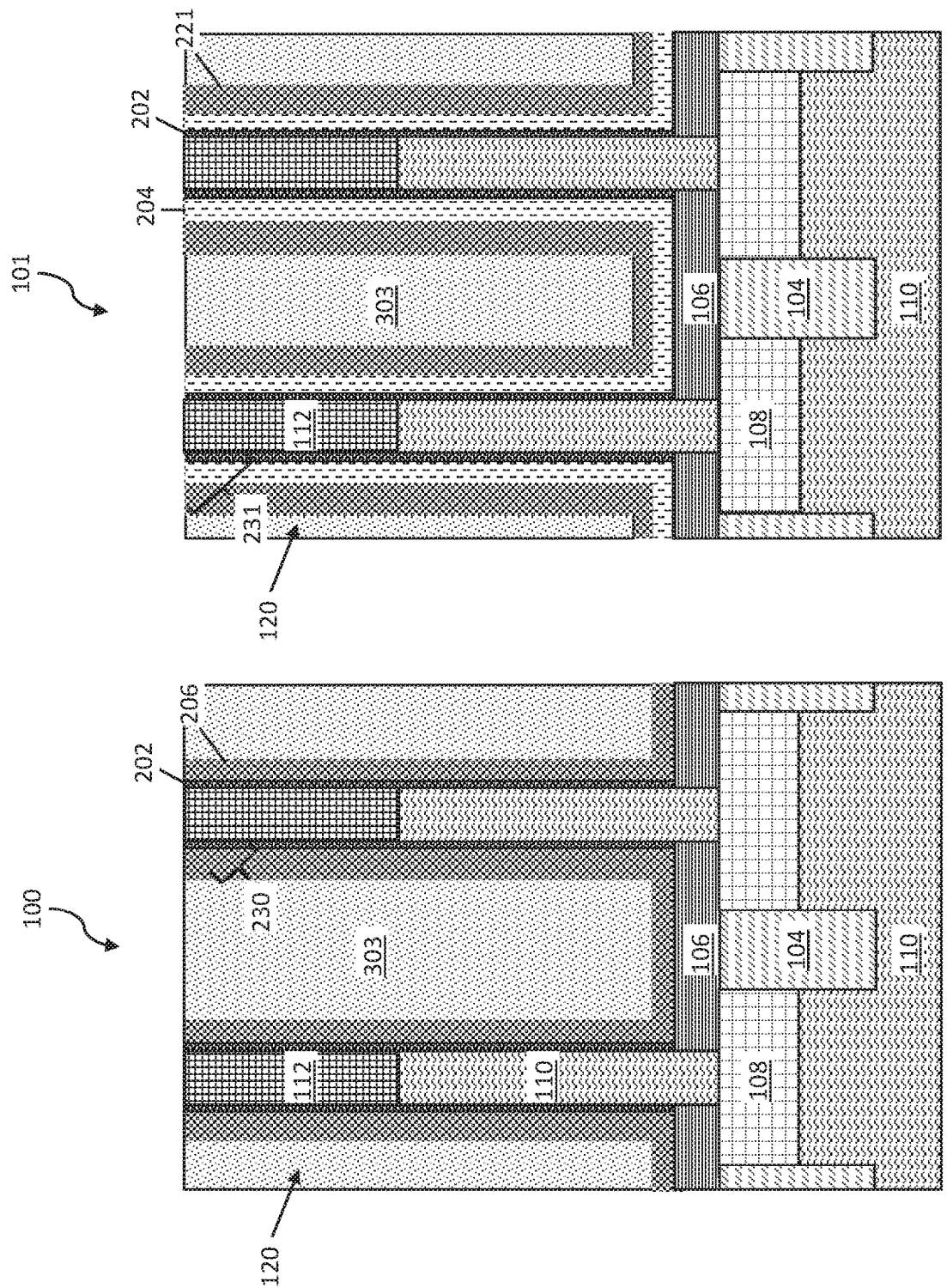

FIG. 3 depicts a cross-sectional side view of the semiconductor device subsequent to depositing an interlayer dielectric (ILD) 303 on the fins 120 of the first transistor 100 and the second transistor 101. The ILD 303 can include, but is not limited to, tetraethylorthosilicate (TEOS) oxide, high aspect ratio plasma (HARP) oxide, high temperature oxide (HTO), high density plasma (HDP) oxide, oxides (e.g., silicon oxides), or any combination thereof. A liner (not shown), such as a SiN liner, can be deposited prior to depositing the ILD 303. After deposition, the ILD 303 is partially recessed, by polishing (e.g., chemical mechanical planarization (CMP)), to at least the level of the hard mask caps 112 of the fins 120 such that the hard mask caps 112 are exposed.

Figure 4:
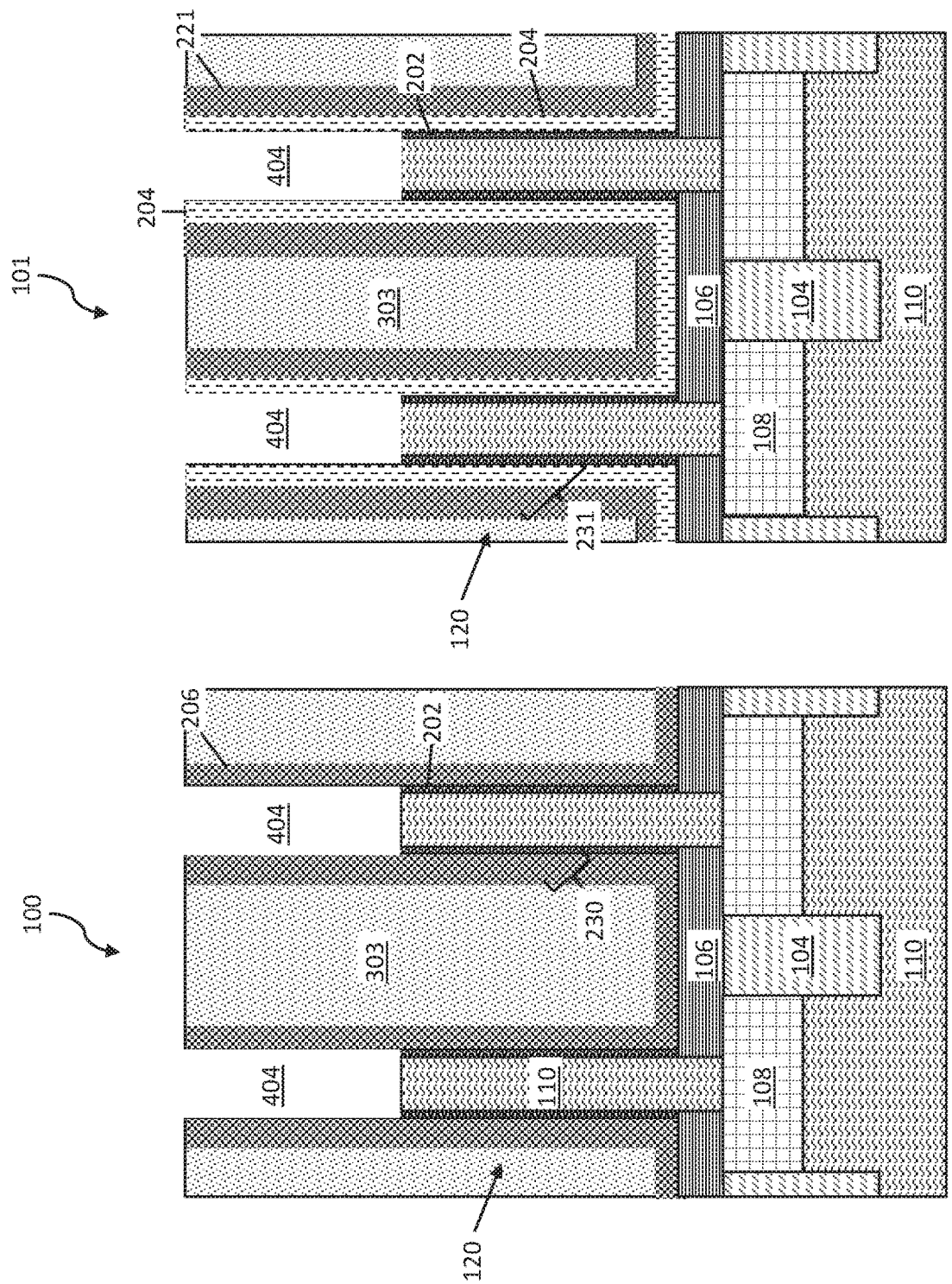

FIG. 4 depicts a cross-sectional side view of the semiconductor device subsequent to removing the hard mask caps 112 and the dielectric layers 202 on the fins 120 of the first transistor 100 and the second transistor 101. Openings 404 over the fins 120 are formed. The hard mask caps 112 and the dielectric layers 202 are removed by one or more etching processes, such that the semiconductor material (the semiconductor substrate 110) of the fins 120 is exposed.

Figure 5:
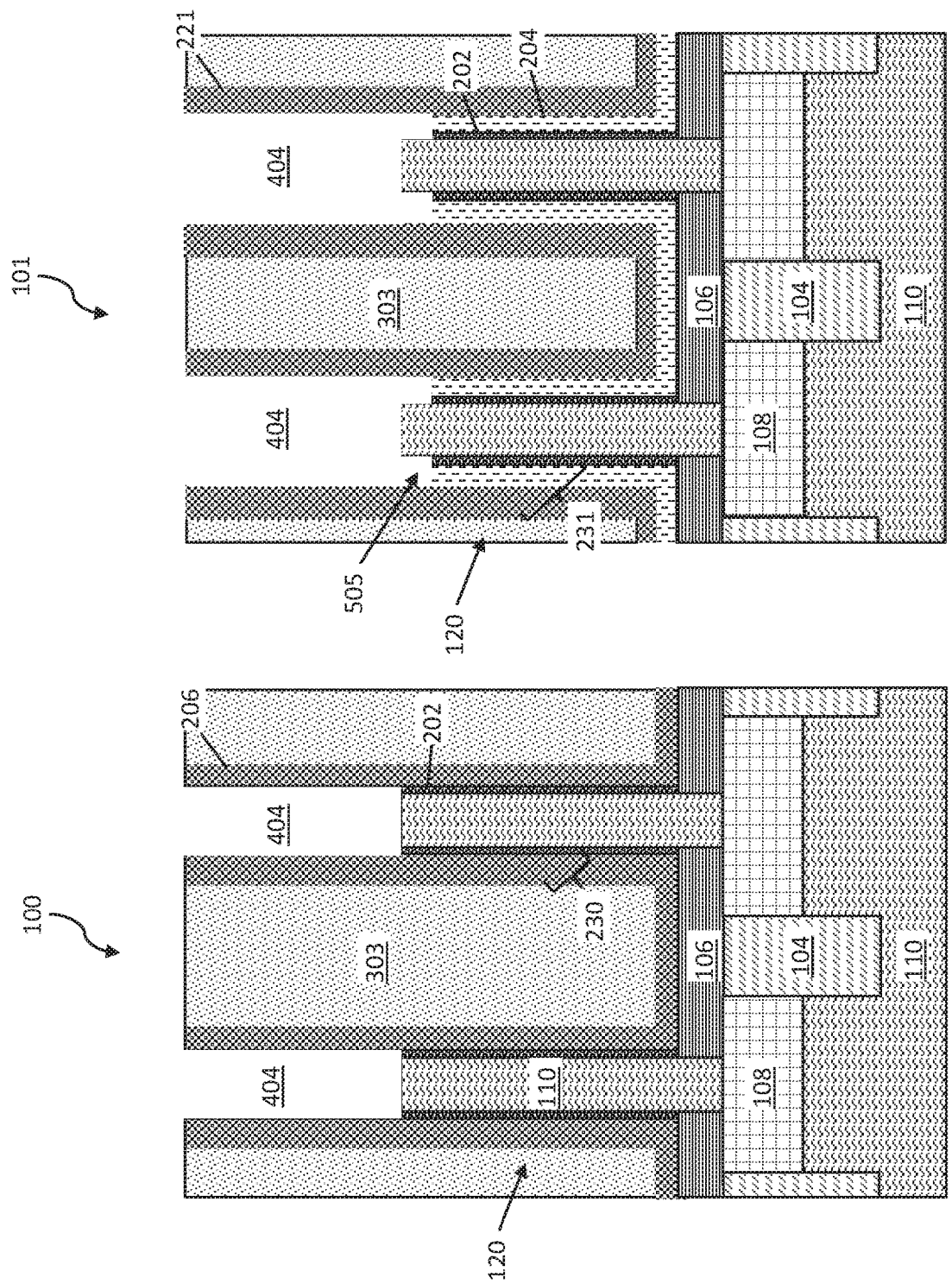

FIG. 5 depicts a cross-sectional side view of the semiconductor device subsequent to selectively removing a portion of the gate stack 231 from the second transistor 101 to form openings 505 adjacent to the fins 120. The dielectric layer 202 and the first work functional metal 204 of the second transistor 101 are partially recessed to a level below the top of the fin 120 to form recesses 505 adjacent to the fins 120 of the second transistor, which exposes vertical sidewalls of the fins 120. One or more etch processes are used to partially recess the dielectric layer 202 and the first work function metal 204 of the second transistor 101. The etching process is selective to the surrounding materials, such as the material of the fin 120, the work function metal 206 of the first transistor 100, and the ILD 303. The openings 404 over the fins 120 of the second transistor 101 become wider than the openings 404 over the fins 120 of the first transistor 100.

Figure 6:
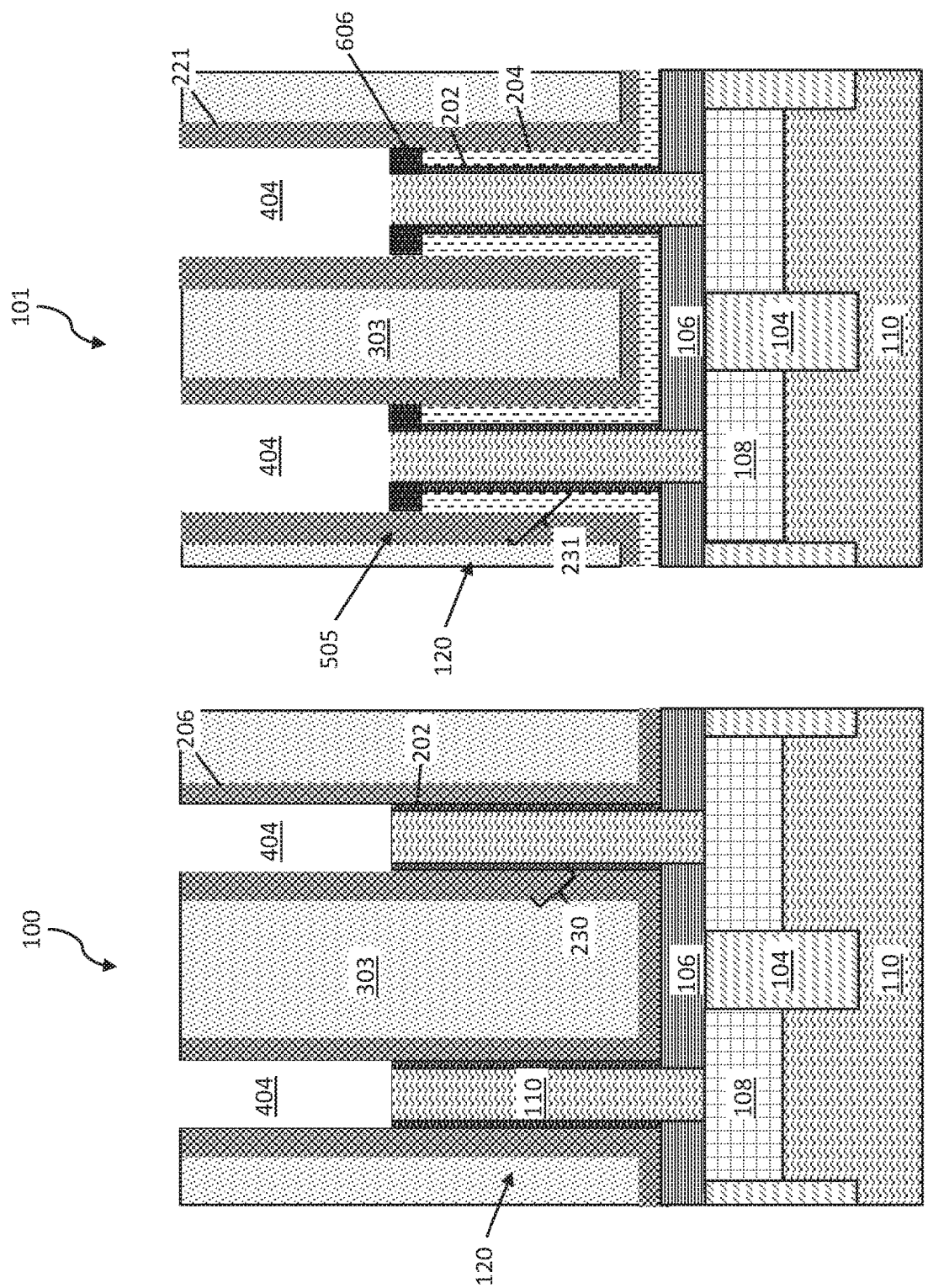

FIG. 6 depicts a cross-sectional side view of the semiconductor device subsequent to depositing a spacer material 606 in the openings formed adjacent to the fins 120 of the second transistor 101. The spacer material 606 forms an inner spacer along fins 120 of the second transistor, which is arranged over and in contact with the recessed gate stack 231 (the dielectric layer 202 and the first work function metal 204). The inner spacer is formed by depositing a thin conformal liner of spacer material 606 to pinch-off the opening 505 but not opening 404, followed by an isotropic etching back of the spacer material 606 such that it is completely removed everywhere except the pinch-off region of opening 505. The inner spacer is arranged in contact with the vertical sidewall of the fin 120. According to some embodiments of the present invention, the spacer material 606 includes SiCO. Other non-limiting examples of materials for the spacer material 606 include SiC, SiBCN, SiOCN.

Figure 7:
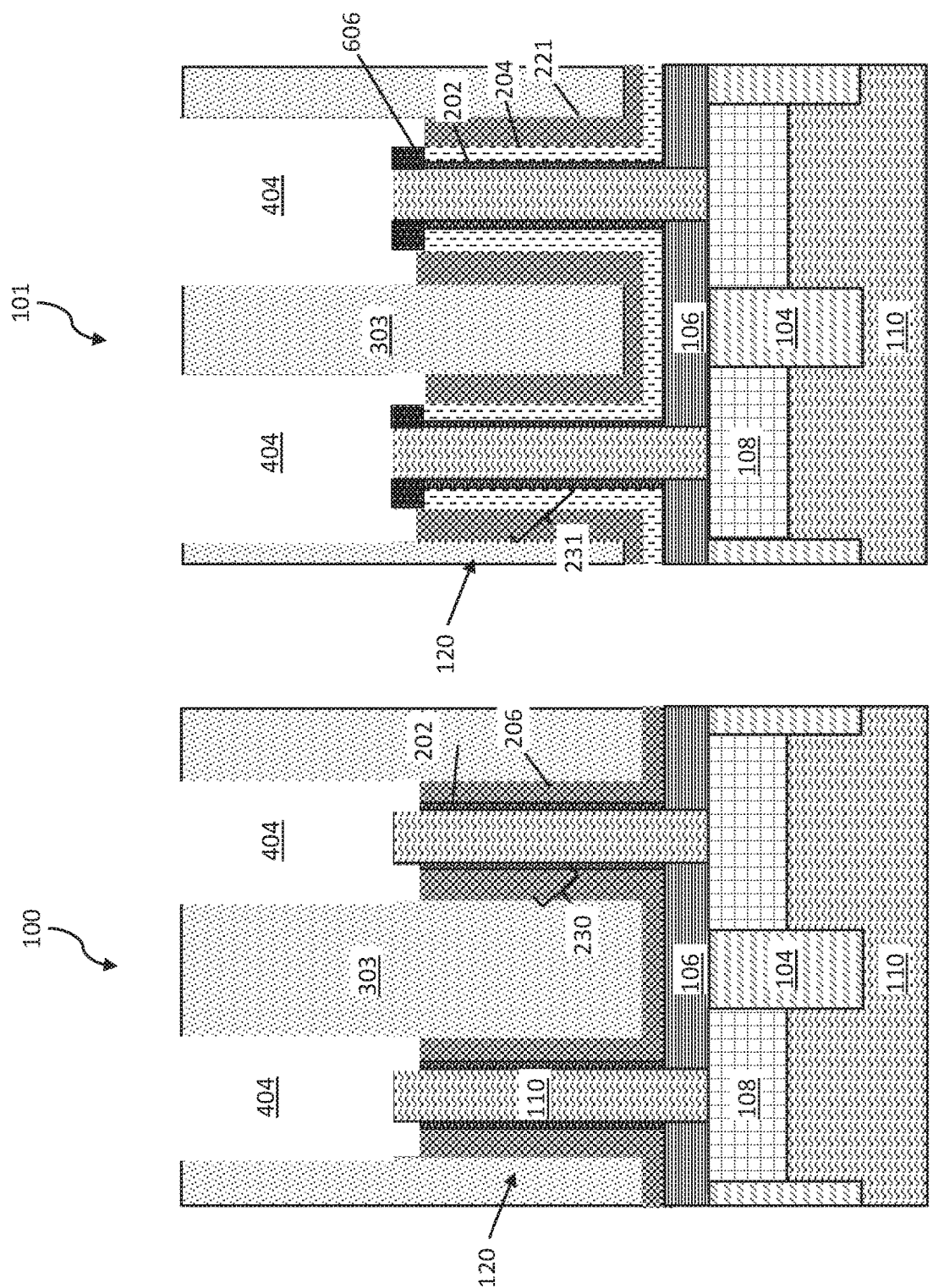

FIG. 7 depicts a cross-sectional side view of the semiconductor device subsequent to further recessing gate stacks 230, 231 of both the first transistor 100 and second transistor 101. The work function metal 206 of the gate stack 230 of the first transistor 100 and the second work function metals 221 of the gate stack 231 of the second transistor 101 are recessed down to a level below the fins 120. In the second transistor with the inner spacers formed of spacer material 606, the second work function metal 221 is recessed below the top of the spacer material 606. Further recessing the second work function metal 221 of the second transistor 101 also widens the width of the openings 404 of the second transistor 101.

The inner spacer including the spacer material 606 protects the first work function metal 204 of the second transistor 101, and allows simultaneous recessing of the work function metals of the first and second transistors (work function metal 206 and second work function metal 221), which have similar thicknesses. The spacer material 606 forming the inner spacer on the second transistor 101 thus enables forming gates with uniform heights.

Figure 8:
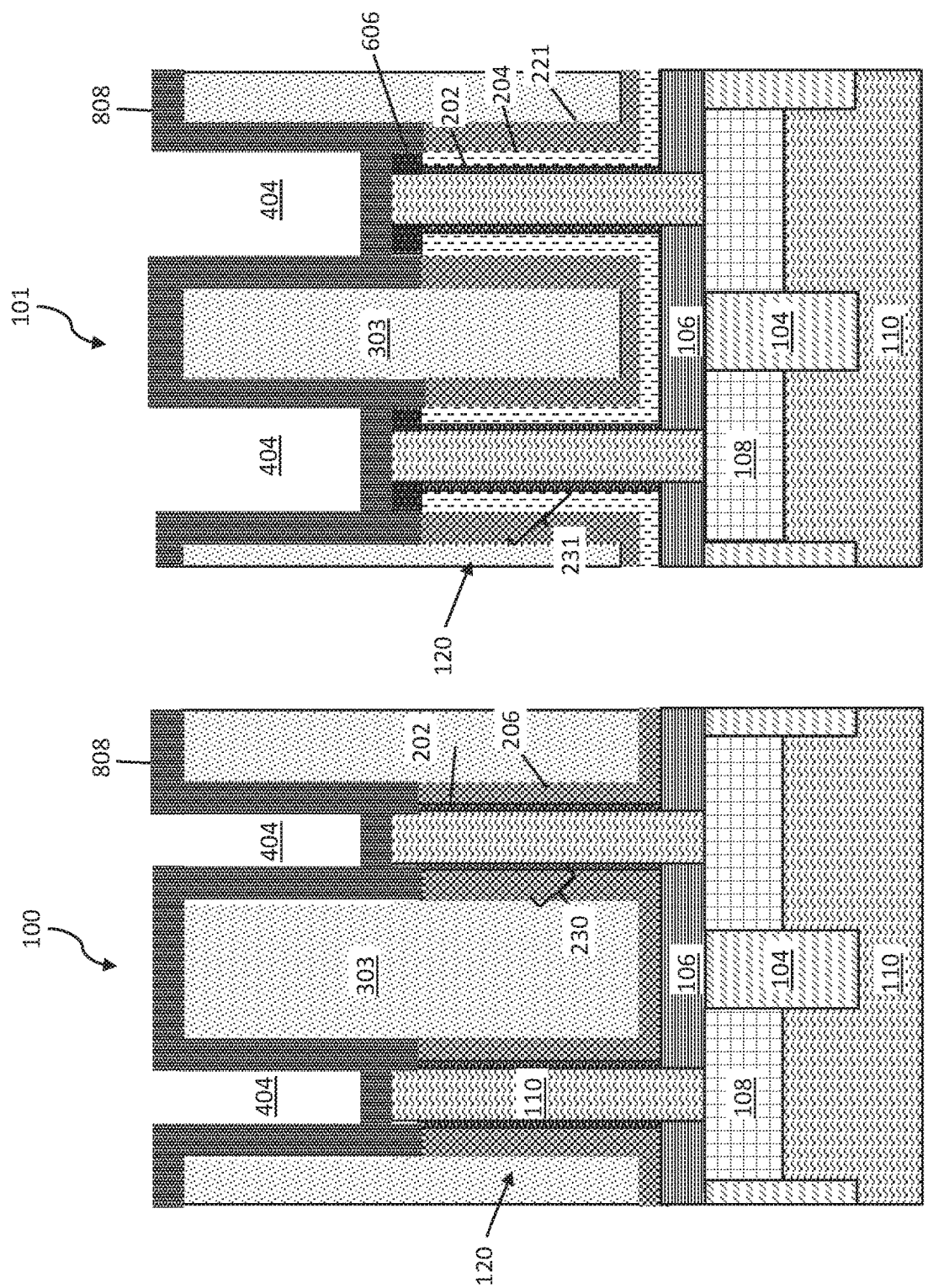

FIG. 8 depicts a cross-sectional side view of the semiconductor device subsequent to depositing a spacer material 808 (also referred to as a second spacer material or outer spacer) on recessed gate stacks of the first transistor 100 and the second transistor 101. The spacer material 808 includes a dielectric material and forms a blanket layer that lines the openings 404 over the fins 120 and covers the fins 120. The spacer 808 includes a different material than spacer material 606 so that subsequent etching of spacer material 808 selective to spacer material 606. Non-limiting examples of dielectric materials for the spacer material 808 include SiN, SiBN, SiCN, SiBCN, SiOCN, SiON, SiO2, or any combination thereof. The spacer material 808 is different than the spacer material 606 according to some embodiments of the present invention.

Figure 9:
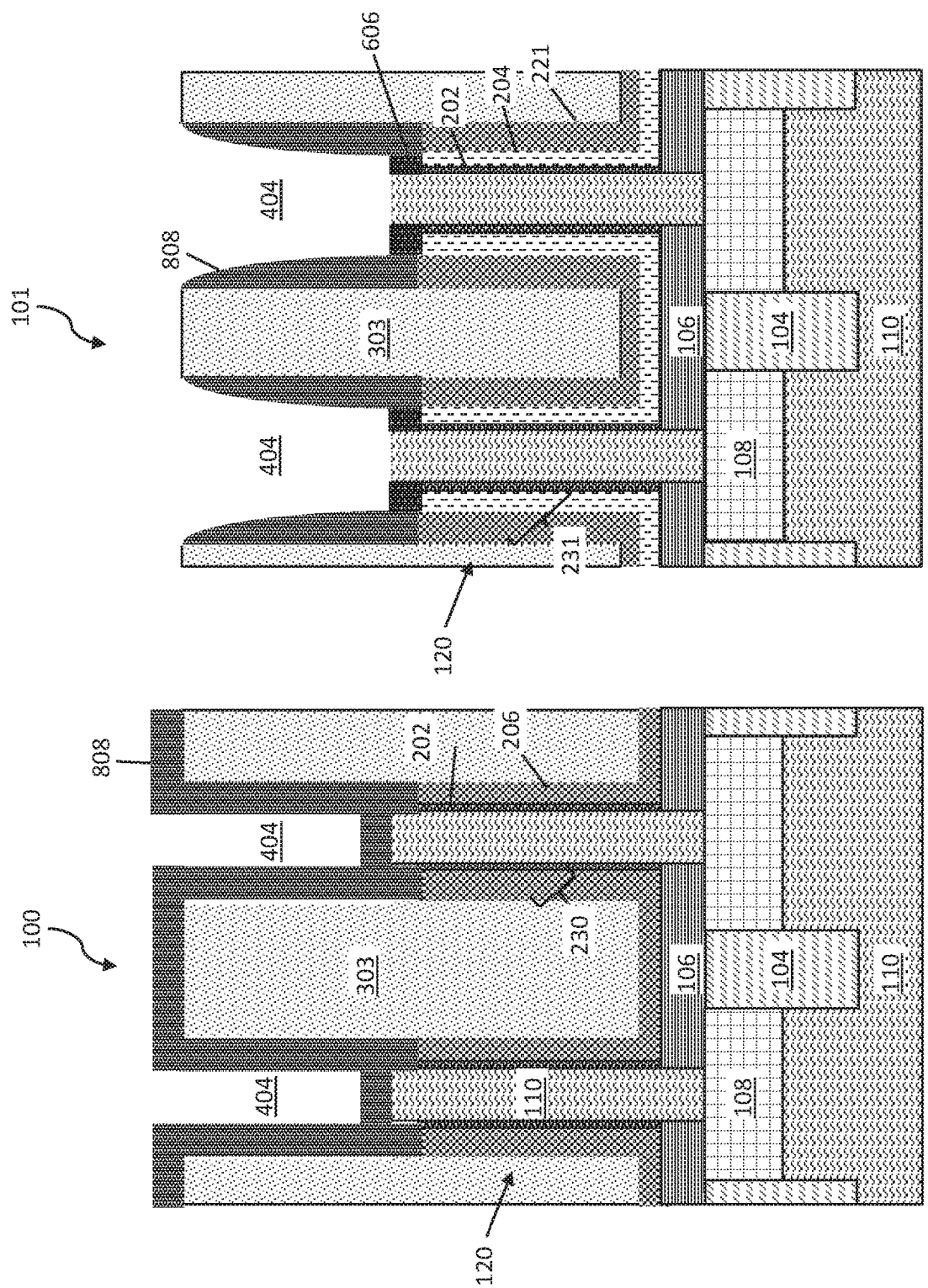

FIG. 9 depicts a cross-sectional side view of the semiconductor device subsequent to etching the spacer material 808 of the second transistor 101 to expose the top surface of the fin 120. This process is achieved by disposing a protecting mask over first transistor 100, and performing spacer RIE for second transistor 101, and then removing the protecting mask. The spacer material 808 remains along sidewalls of the openings 404 in the ILD 303. One or more anisotropic etch processes, such as a reactive ion etch (RIE) can be used to etch the spacer material 808 selective to spacer material 606.

Figure 10:
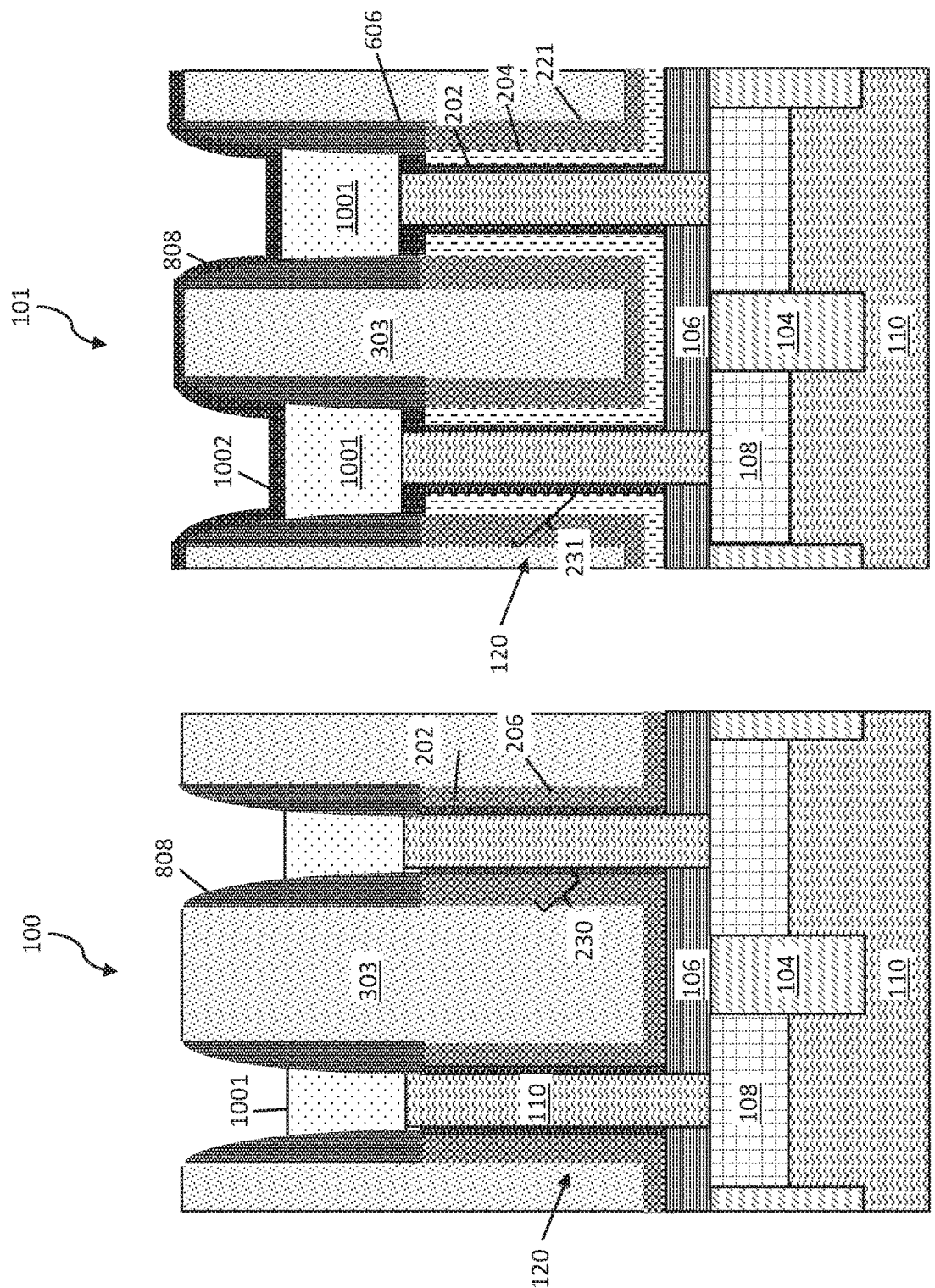

FIG. 10 depicts a cross-sectional side view of the semiconductor device subsequent to forming the top source/drain 1001 for second transistor 101. A protecting layer 1002 is deposited over both first transistor 100 (not shown) and second transistor 101, and a protecting mask is disposed on the first transistor 100 to protect first transistor 101. Cap layer 1002 is removed, and spacer material 808 is removed by a reactive ion etch in the first transistor 100. Then the protecting mask is removed to form the top source/drain 1001 in the first transistor 100. According to some embodiments of the present invention, the top source/drain 1001 of the first transistor 100 includes epitaxial phosphorus doped silicon, and the top source/drain 100 of the second transistor 101 includes boron doped silicon germanium.

The spacer material 808 of the first transistor 100 is anisotropically etched to form the sidewall spacers along the openings over the fins 120. Top source/drains 1001 are arranged on and in contact with the fins 120 of the first transistor 100. The second spacer material 808 forms the outer spacers of the second transistor 101 and are arranged on sidewalls of the top source/drains 1001 of both transistors. In the second transistor 101, the spacer material 808 of the second outer spacer is arranged adjacent to the first inner spacer including the spacer material 606 and directly on a portion of the recessed gate stack 231 (in particular, the second work function metal 221). The second spacer material 808 is arranged adjacent to the first spacer including the spacer material 606. The second spacer material 808 is also arranged over and in contact with the recessed gate stack 230 of the first transistor 100 and the recessed gate stack 231 of the second transistor 101.

The top source/drains 1001 of the second transistor 101 are wider than the top source/drains 1001 of the first transistor 100. According to some embodiments of the present invention, the top source/drains 1001 of the first transistor 100 has a different volume than the top source/drains 1001 of the second transistor 101.

Figure 11:
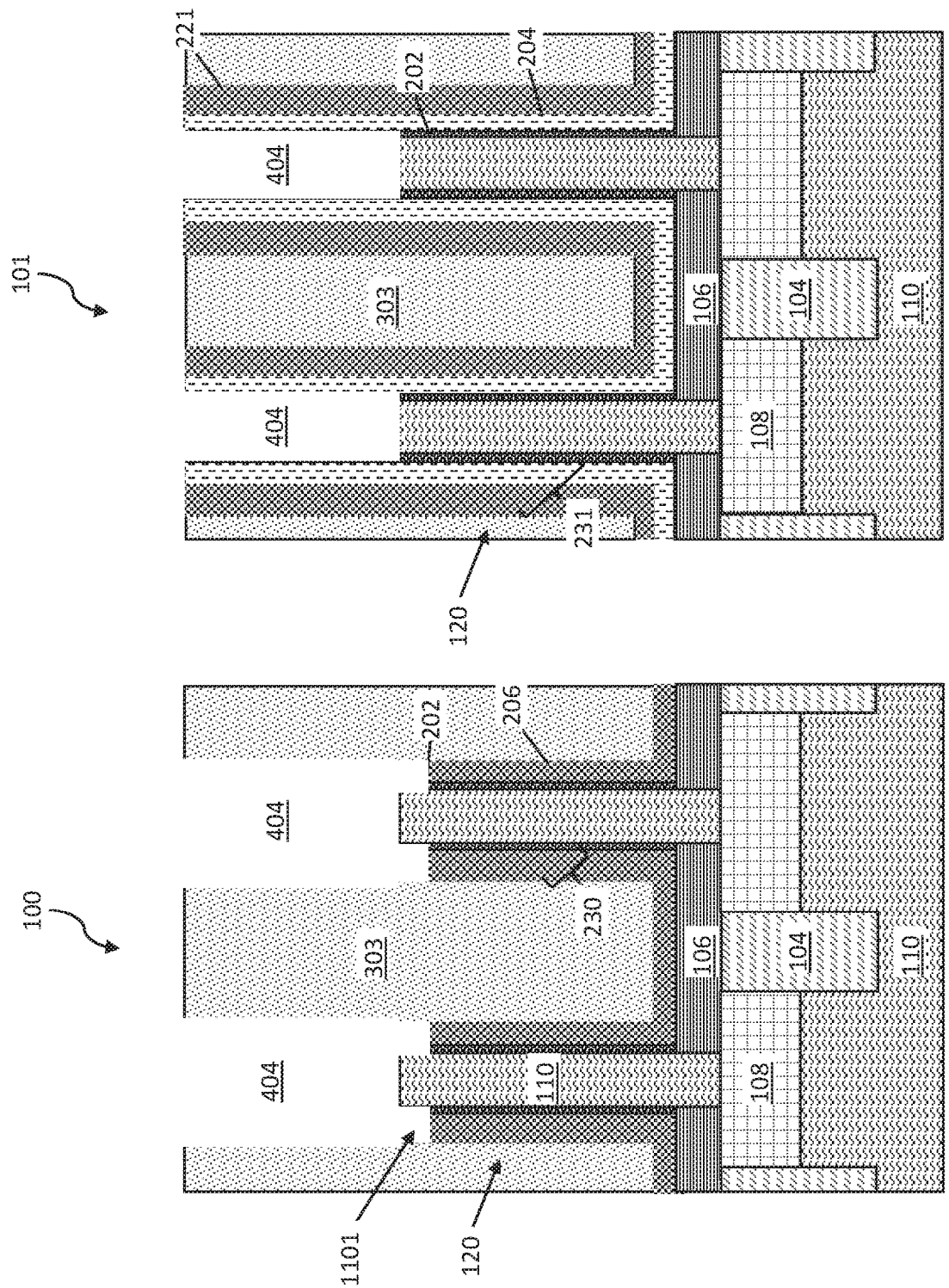

FIGS. 11-16 depict a process flow for forming a semiconductor device according to embodiments of the present invention. FIG. 11 depicts a cross-sectional side view of the semiconductor device of FIG. 4, subsequent to selectively removing a portion of the gate stack 230 from the first transistor 100 to form recess openings 1101 adjacent to the fin 120. The etching process is chosen such that it etches the work function metal 206 of the first transistor 100 selective to the work function metals (first work function metal 204 and second work function metal 221) of the second transistor 101 and other surrounding materials. The dielectric layer 202 and the work function metal 206 of the gate stack 230 of the first transistor 100 are recessed to a level below the top surface of the fin 120, such that vertical sidewalls of the fin 120 are exposed. The second transistor 101 remains protected.

Figure 12:
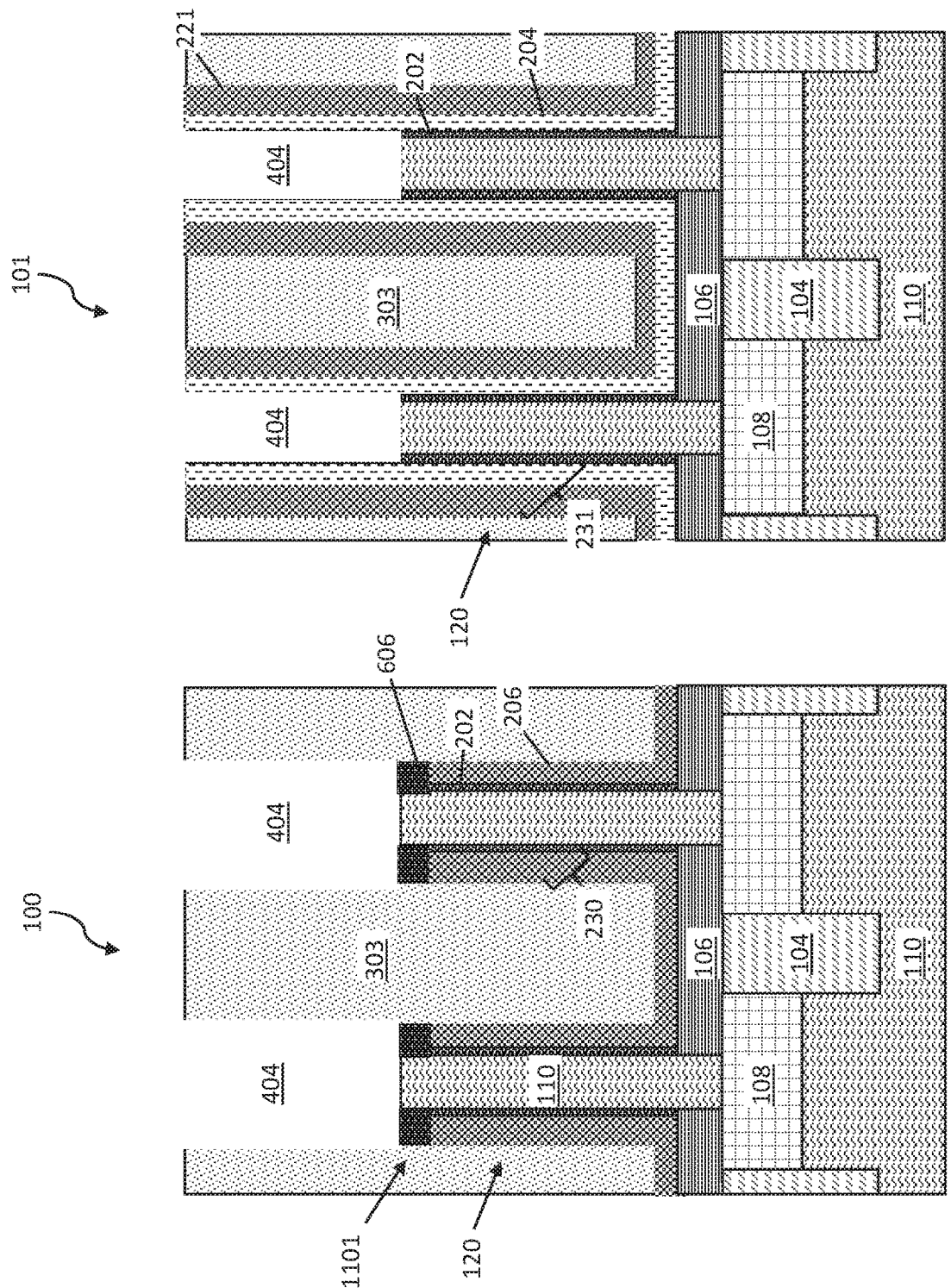

FIG. 12 depicts a cross-sectional side view of the semiconductor device subsequent to depositing a spacer material 606 in the openings 1101. The spacer material 606 forms an inner spacer along fins 120 of the first transistor 100, which is arranged over and in contact with the dielectric layer 202 and the work function metal 206.

Figure 13:
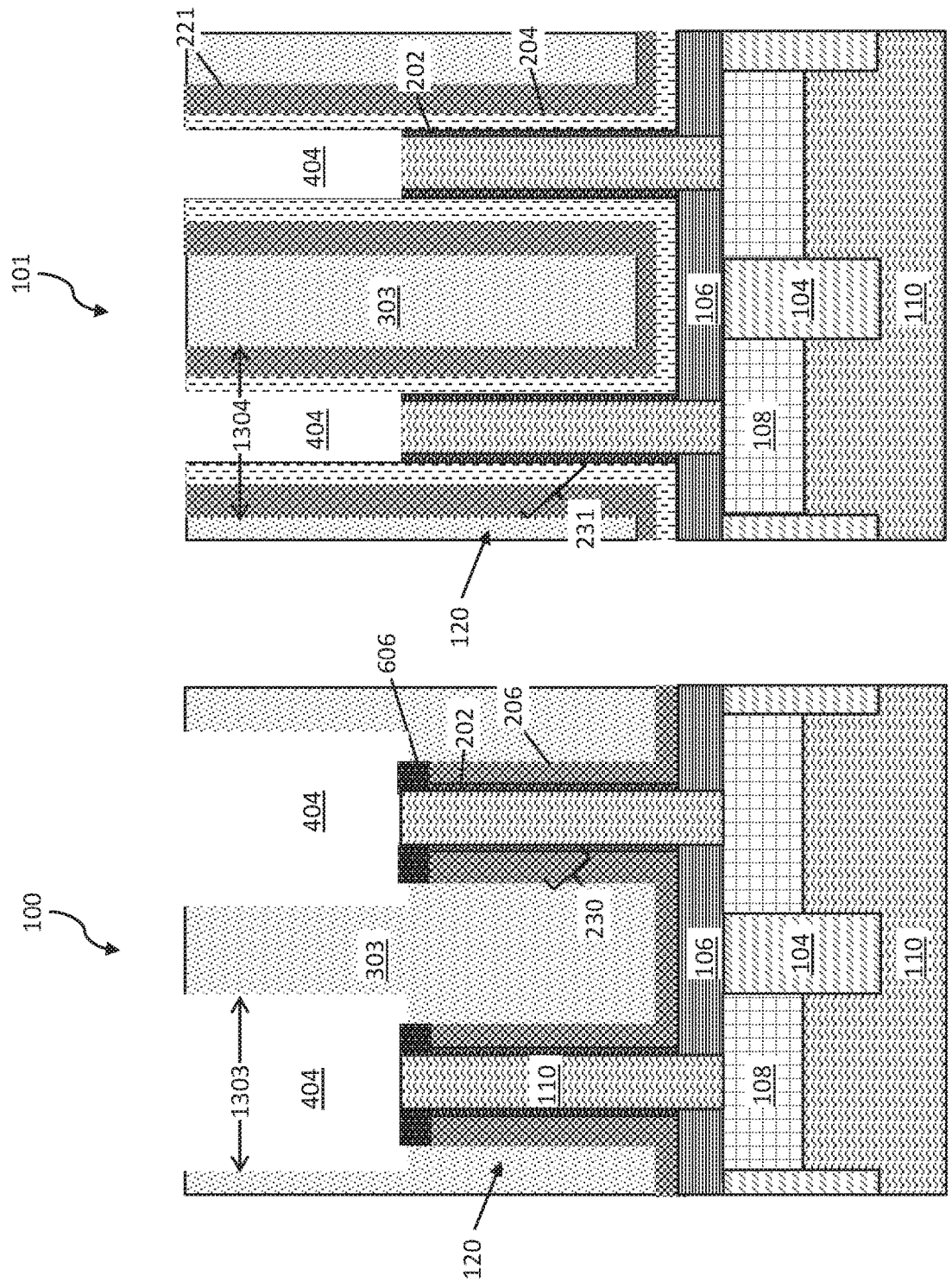

FIG. 13 depicts a cross-sectional side view of the semiconductor device subsequent to widening the diameter of the openings 404 in the ILD 303 of the first transistor 100. The width 1303 of the opening 404 over the fin 120 of the first transistor 100 is widened to be substantially the same width 1304 of the opening in the ILD 303 in which the first work function metal 204 and second work function metal 221 of the gate stack 231 of the second transistor 102 are arranged.

Figure 14:
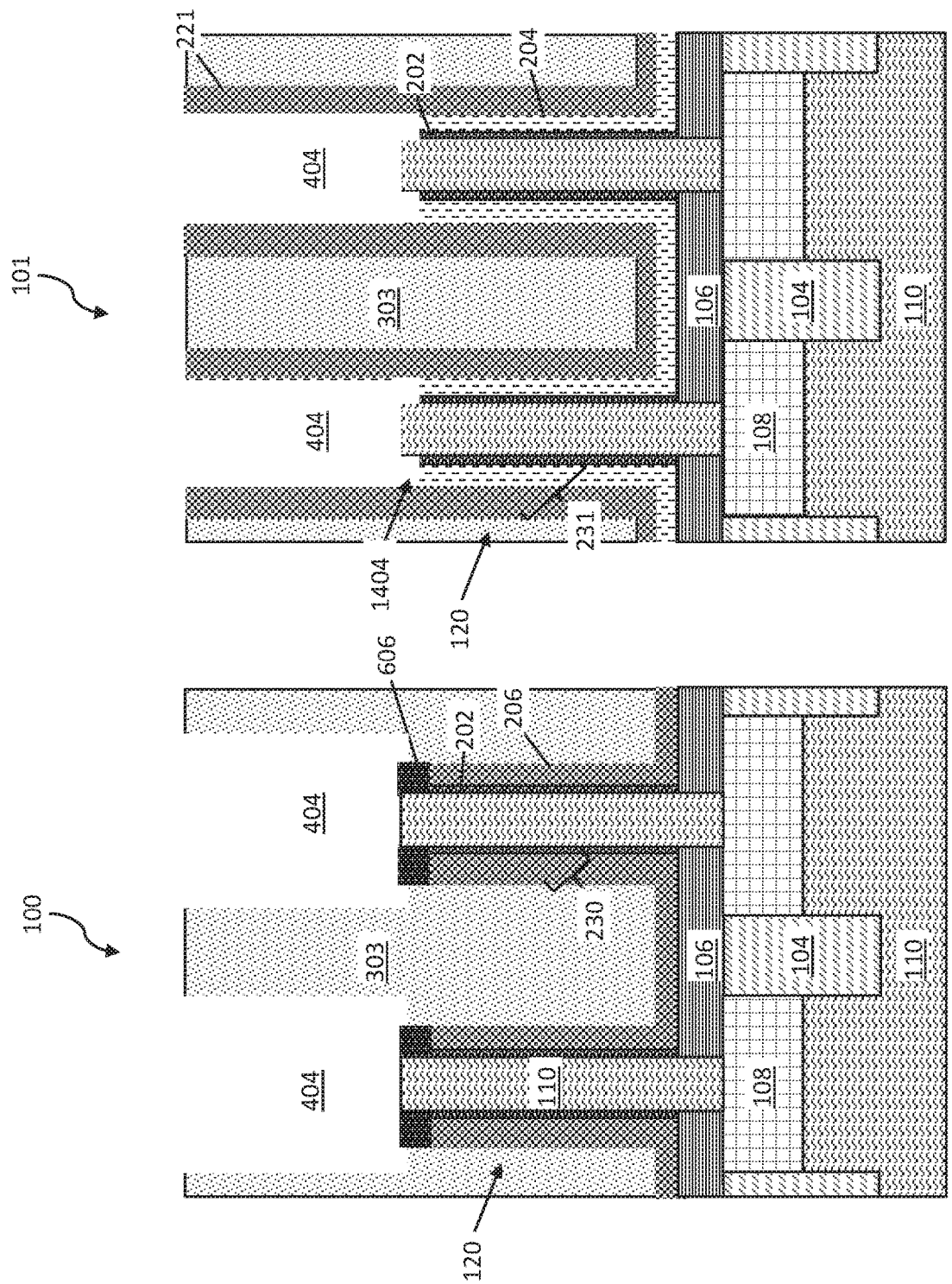

FIG. 14 depicts a cross-sectional side view of the semiconductor device subsequent to recessing a portion of the gate stack 231 of the second transistor 101. The dielectric layer 202 and the first work function metal 204 are recessed to a level below the top surface of the fin 120 such that vertical sidewalls of the fin 120 are exposed and openings 1404 are formed adjacent to the fins 120.

Figure 15:
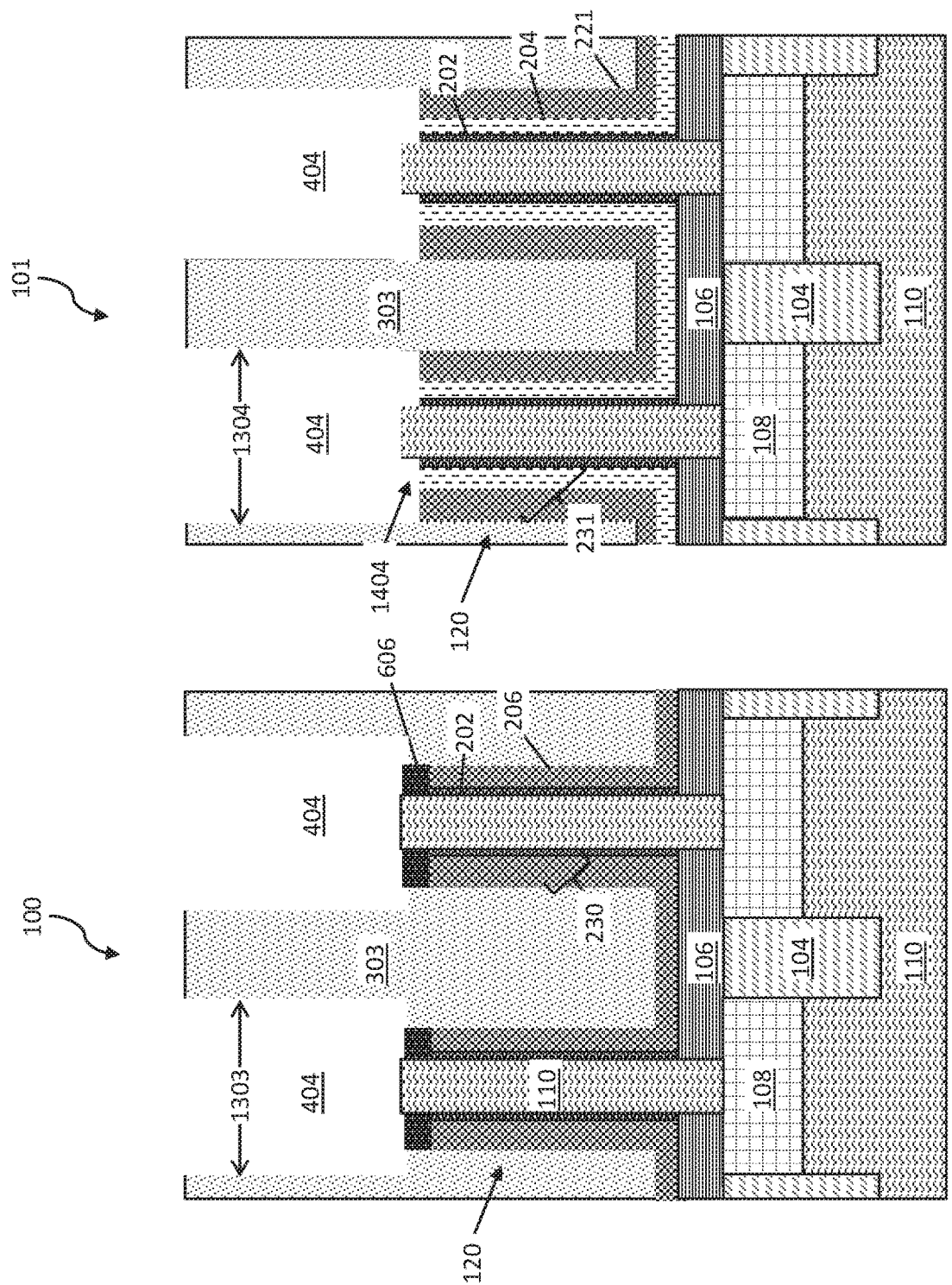

FIG. 15 depicts a cross-sectional side view of the semiconductor device subsequent to further recessing the gate stack 231 of the second transistor 101. The second work function metal 221 of the gate stack 231 of the second transistor 101 is recessed to the level of the first work function metal 204, which widens the openings 1404 adjacent to the fin 120. After recessing both gate stacks, the width 1303 of the opening 404 of the first transistor 100 is the same as the width 1304 of the opening 404 of the second transistor 101.

Figure 16:
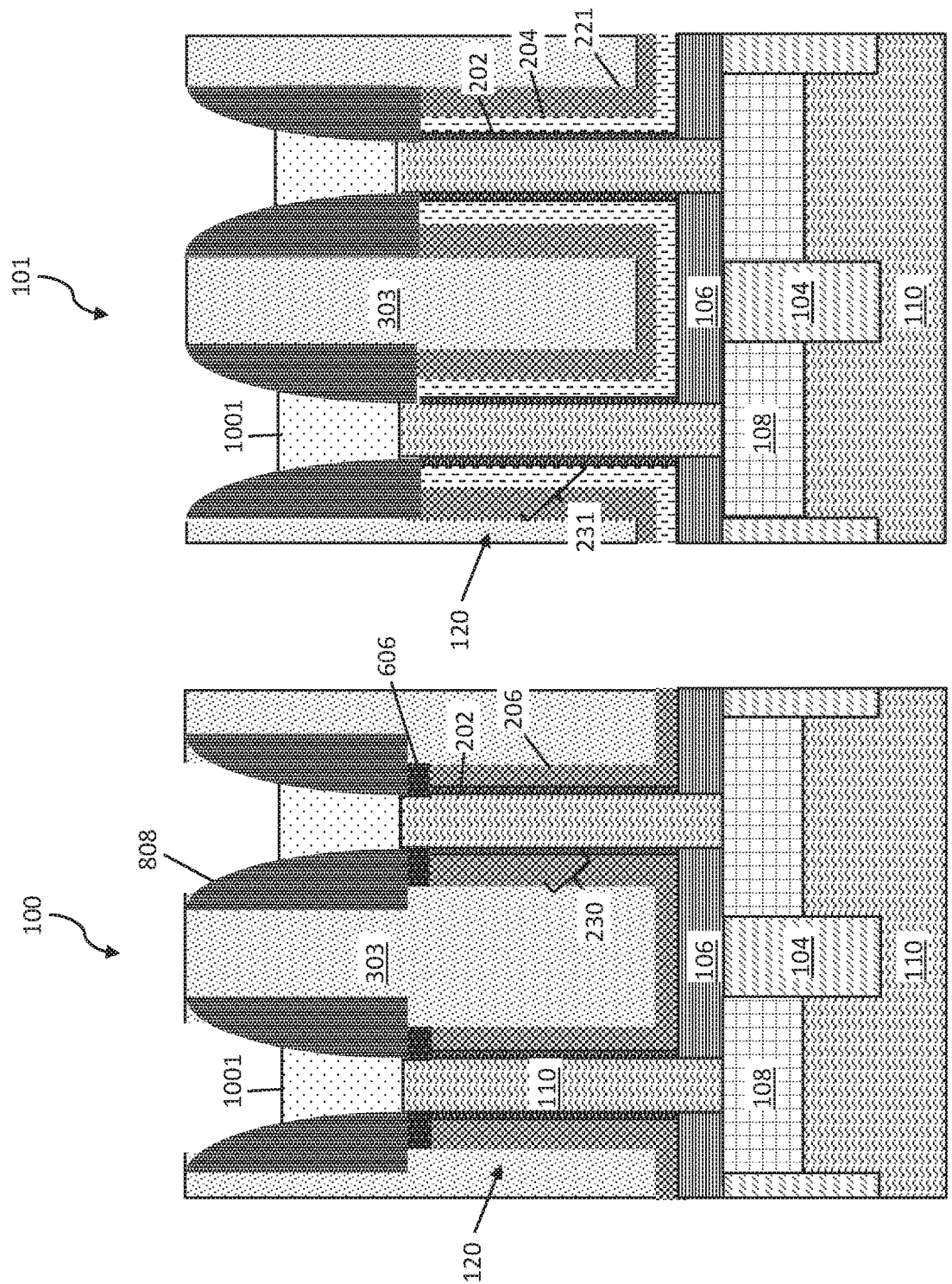

FIG. 16 depicts a cross-sectional side view of the semiconductor device subsequent to forming spacers including spacer material 808 and top source/drains 1001. As the width 1303 of the opening of the first transistor 100 is the same as the width 1304 of the opening of the second transistor 101 (see FIG. 15), the top source/drains 1001 of the first and second transistors 100, 101 have about the same volume. The second spacer including the spacer material 808 is arranged over the gate stack 230 of the first transistor 100. It is noted that the top source/drain 1001 of the first transistor 100 and the second transistor 101 include different materials, and therefore additional processing steps used to form the separate top source/drains are omitted.

Figure 17:
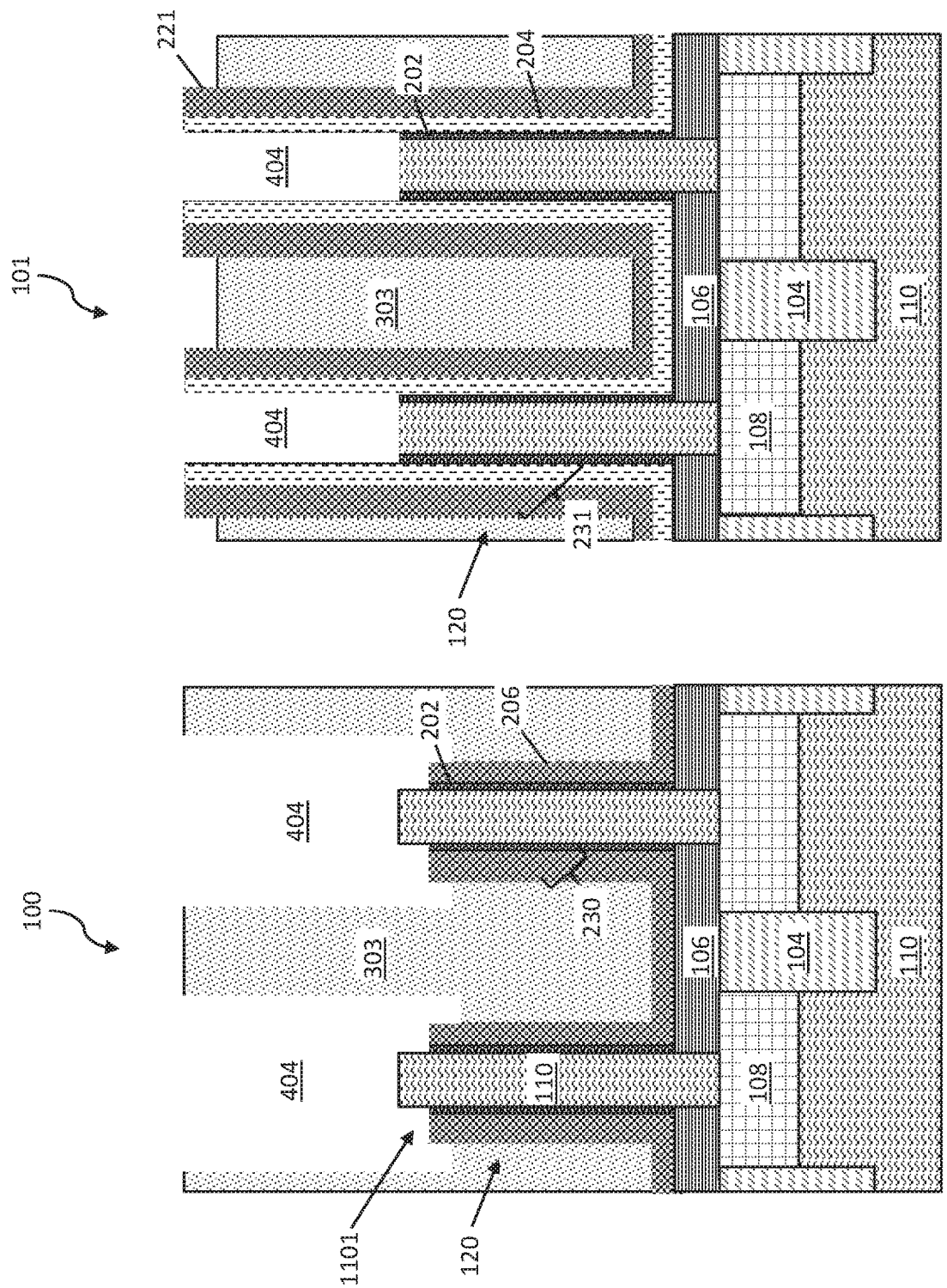

FIGS. 17-20 depict a process flow for forming a semiconductor device according to embodiments of the present invention. FIG. 17 depicts a cross-sectional side view of the semiconductor device of FIG. 11, subsequent to selectively removing a portion of the gate stack 230 from the first transistor 100. The etching process is chosen such that it etches the work function metal 206 of the first transistor 100 selective to the work function metals of the second transistor 101. The ILD 303 is recessed around the fins 120 of the first transistor 100 and the second transistor 101. The opening 404 around the fins 120 of the first transistor 100 widens. Openings 1101 are formed adjacent to the fins 120 and surrounding gate stack 230 of the first transistor 100.

Figure 18:
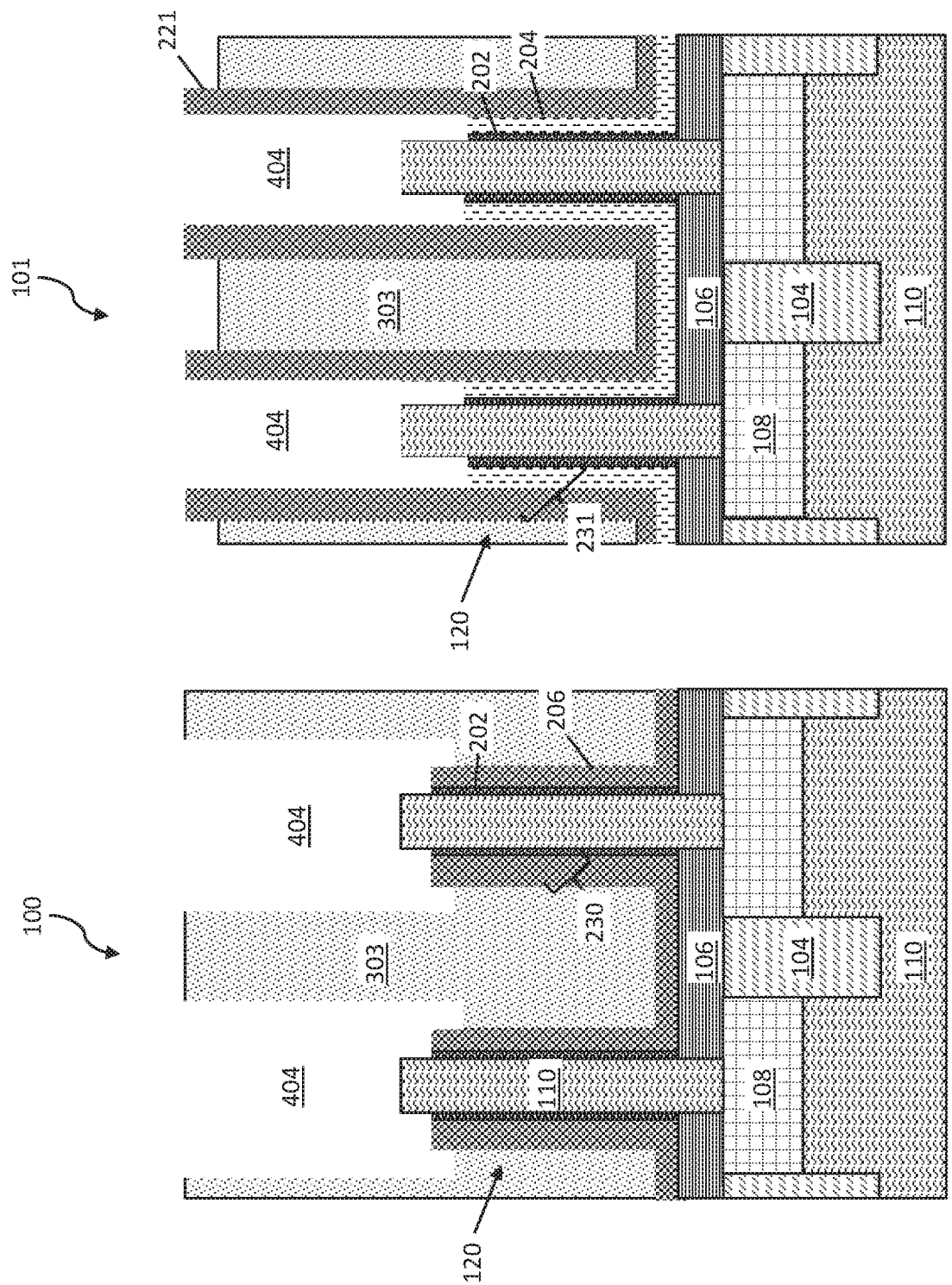

FIG. 18 depicts a cross-sectional side view of the semiconductor device subsequent to recessing a portion of the gate stack 231 of the second transistor 101. An etching process is chosen that etches the gate stack 231 of the second transistor 101 selective to the gate stack 230 of the first transistor 100. The dielectric layer 202 and the first work function metal layer 204 are partially recessed around the fin 120.

Figure 19:
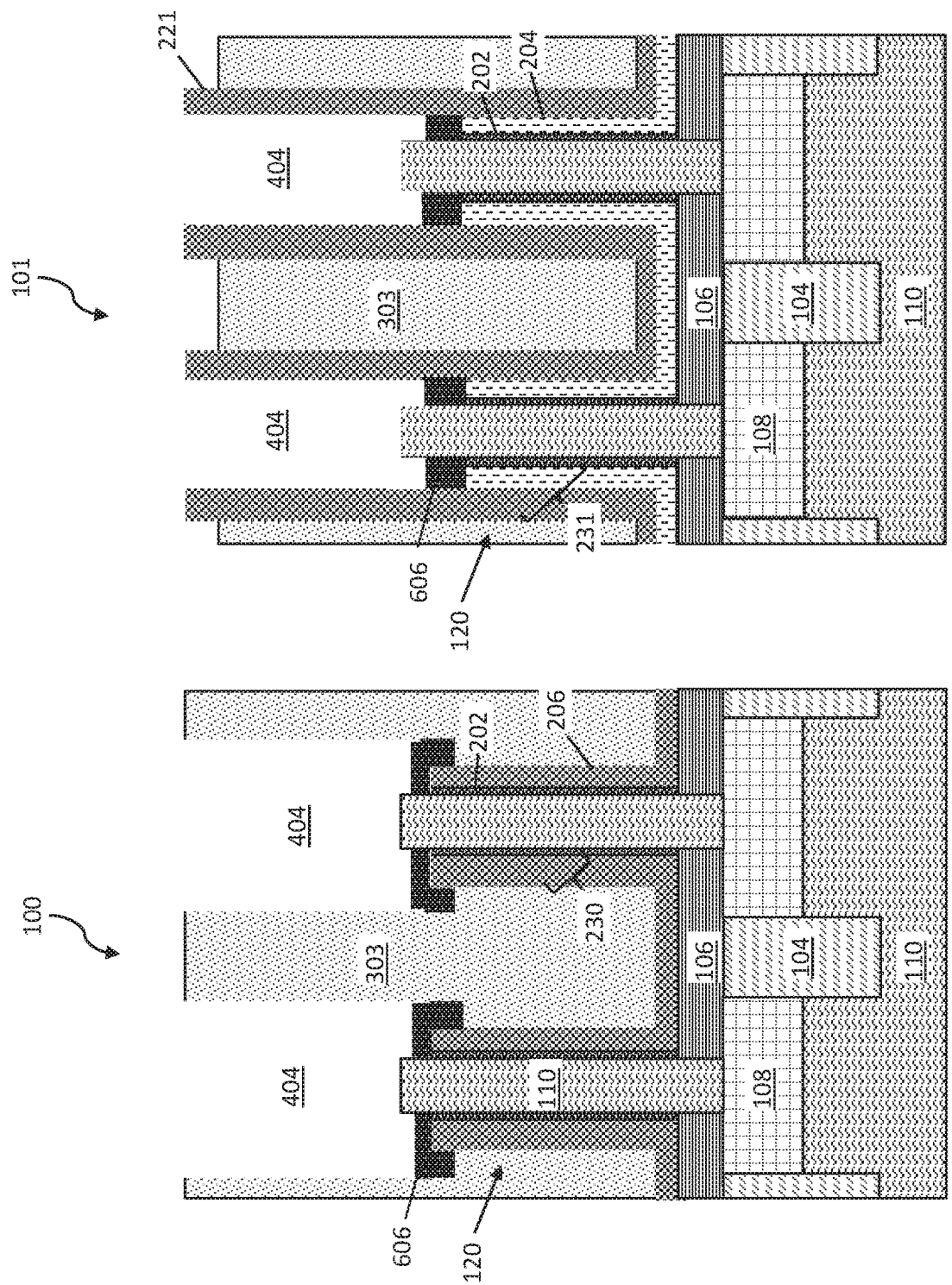

FIG. 19 depicts a cross-sectional side view of the semiconductor device subsequent to depositing spacer material 606 in the openings arranged adjacent to the fins 120 of the first transistor 100 and the second transistor 101.

Figure 20:
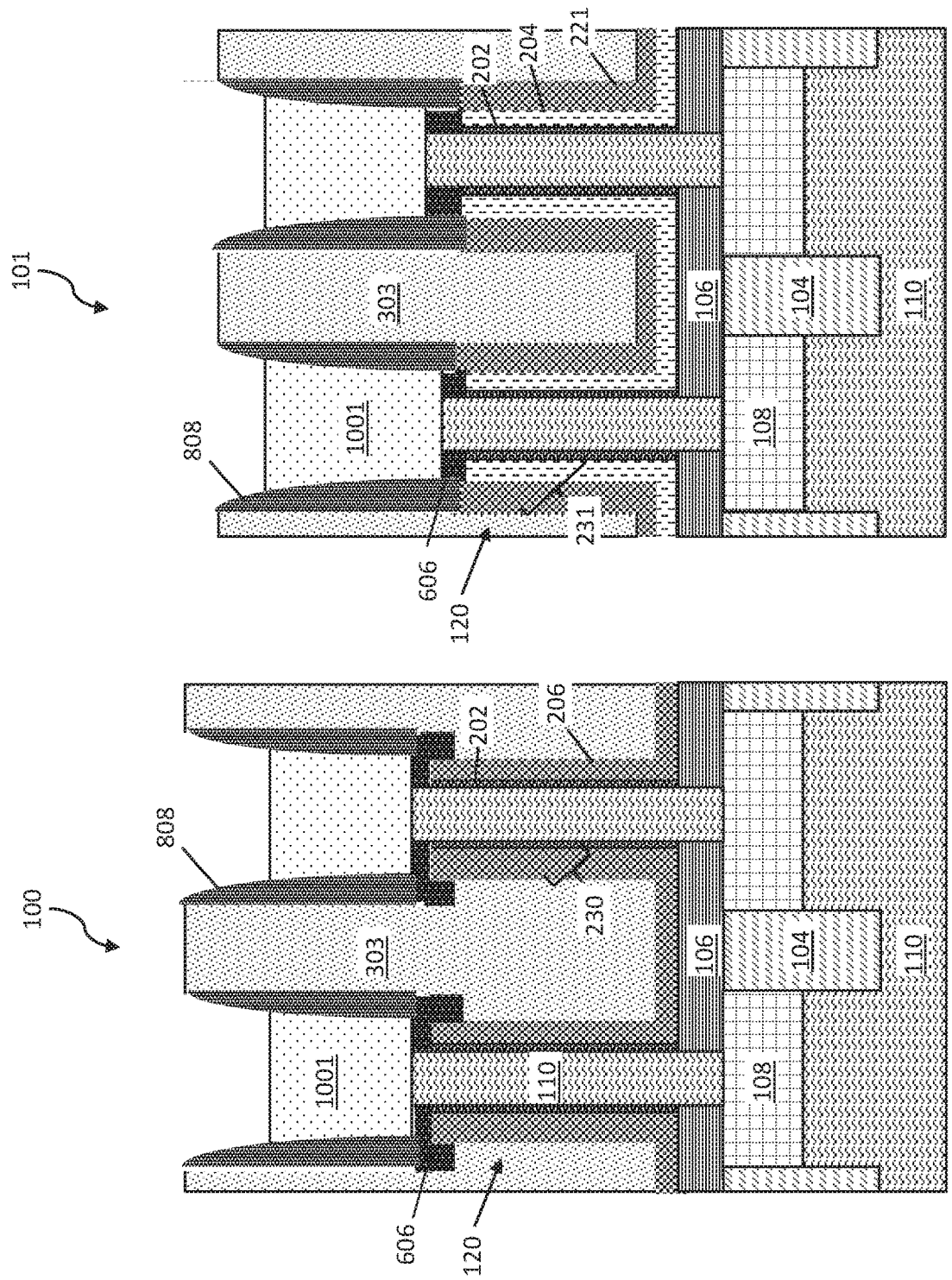

FIG. 20 depicts a cross-sectional side view of the semiconductor device subsequent to further recessing the gate stack 231 of the second transistor 101 and forming second outer spacers 808 and top source/drains 1001. The second work function metal 221 of the gate stack 231 of the second transistor 101 is recessed below the inner spacer formed by the spacer material 1919.

In the first transistor 100, the first spacer (spacer material 606) is arranged in contact with the vertical fin 120 and on the recessed gate stack 230, and the second spacer (spacer material 808) is arranged in contact with the first spacer and lines sidewalls of the top source/drains. In the second transistor 101, the first spacer (spacer material 606) is arranged in contact with the vertical fin 120 and on a portion of the recessed gate stack 231, and the second spacer (spacer material 808) is arranged in contact with the first spacer and lines sidewalls of the top source/drain 1001. The volumes of the top source/drains 1001 of the first transistor 100 and second transistor are approximately the same.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
   a first transistor comprising a first vertical fin arranged between a first bottom source or drain (S/D) region and a first top S/D region, and a first recessed gate stack arranged on a sidewall of the first vertical fin;
   a second transistor comprising a second vertical fin arranged between a second bottom S/D region and a second top S/D region, and a second recessed gate stack arranged on a sidewall of the second vertical fin;
   a first spacer in contact with the sidewall of the first vertical fin, the first spacer further arranged on the first recessed gate stack of the first transistor, and the first spacer further arranged on the second recessed gate stack of the second transistor; and
   a second spacer in contact with the first spacer of the first transistor or the second transistor, the second spacer further arranged on a sidewall of the first top S/D) region of the first transistor, and the second spacer further arranged on a sidewall of the second top S/D of the second transistor,
   wherein the first spacer and the second spacer comprise different materials.

2. The semiconductor device of claim 1, wherein the recessed gate stack of the first transistor and the gate stack of the second transistor comprise different thicknesses.

3. The semiconductor device of claim 1, wherein the first transistor is an NFET, and the second transistor is a PFET.

4. The semiconductor device of claim 1, wherein the second spacer is arranged adjacent to the first spacer.

5. The semiconductor device of claim 1, wherein the second spacer is arranged over the gate stack of the first transistor, and the second spacer is arranged over the gate stack of the second transistor.

6. A semiconductor device of claim 1, wherein the first top S/D region of the first transistor and the second top S/D of the second transistor have different volumes.

\* \* \* \* \*